US007462556B2

(12) United States Patent
Wang

(10) Patent No.: US 7,462,556 B2
(45) Date of Patent: Dec. 9, 2008

(54) METHOD OF FORMING LOW STRESS MULTI-LAYER METALLURGICAL STRUCTURES AND HIGH RELIABLE LEAD FREE SOLDER TERMINATION ELECTRODES

(75) Inventor: Tsing Chow Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 86 days.

(21) Appl. No.: 11/176,871

(22) Filed: Jul. 6, 2005

(65) Prior Publication Data

US 2006/0234489 A1 Oct. 19, 2006

(30) Foreign Application Priority Data

Apr. 15, 2005 (CN) ........................ 2005 1 0025198

(51) Int. Cl.
*H01L 21/44* (2006.01)

(52) U.S. Cl. ................ 438/613; 438/676; 257/E21.508

(58) Field of Classification Search ................. 438/676; 257/E21.508

See application file for complete search history.

(56) References Cited

U.S. PATENT DOCUMENTS 3,663,184 A 5/1972 Wood et al.
4,290,079 A 9/1981 Carpenter et al.
4,514,751 A 4/1985 Bhattacharya
5,937,320 A * 8/1999 Andricacos et al. ......... 438/614
6,316,813 B1 11/2001 Ohmi et al.
6,586,303 B2 * 7/2003 Wu ........................... 438/262
6,740,427 B2 * 5/2004 Datta et al. ................. 428/660
6,798,050 B1 * 9/2004 Homma et al. .............. 257/678
7,176,583 B2 * 2/2007 Daubenspeck et al. ...... 257/781
2002/0185733 A1 * 12/2002 Chow et al. ................. 257/737

* cited by examiner

*Primary Examiner*—Scott B. Geyer
*Assistant Examiner*—Seahvosh J Nikmanesh
(74) *Attorney, Agent, or Firm*—Townsend and Townsend and Crew LLP

(57) ABSTRACT

Techniques for manufacturing a bond pad structure are provide. A method includes providing a substrate. A metal pad and passivation layer are formed over the substrate. The passivation layer includes an opening to expose a portion of the metal pad. A first film is deposited at least over the exposed portion of the metal pad. A second film is deposited over the first film. A photoresist layer is deposited over the substrate, and a trench is formed in the photoresist layer directly over the portion of the metal pad. A first layer is electroplated in the trench over the second film, and a barrier layer is electroplated in trench over the first layer. A termination electrode, comprising tin, is electroplated in the trench over the barrier layer. The photoresist layer is removed. In addition, the method can include etching to remove the second film and first film beyond a predetermined area. The termination electrode is then reflowed. The barrier layer prevents formation of an intermetallic compound in proximity to the first layer by precluding diffusion of tin from the termination electrode to the first layer. In a specific embodiment, the first layer includes stress release copper underneath a barrier layer which includes nickel.

14 Claims, 6 Drawing Sheets

METHOD OF FORMING LOW STRESS MULTI-LAYER METALLURGICAL STRUCTURES AND HIGH RELIABLE LEAD FREE SOLDER TERMINATION ELECTRODES

CROSS-REFERENCE TO RELATED APPLICATION

This application claims priority to Chinese Application No. 200510025198.X, filed Apr. 15, 2005, commonly assigned, and incorporated herein by reference for all purposes.

BACKGROUND OF THE INVENTION

The present invention is directed to integrated circuits and their processing for the manufacture of semiconductor devices. More particularly, the invention provides methods and structures for manufacturing bonding pad structures for advanced integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry," has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of bonding pad structures of integrated circuit devices. Such bonding pad structures have traditionally became smaller and smaller and occupy a smaller region of silicon real estate. Although there have been significant improvements, designs for bond pad structures still have many limitations. As merely an example, these designs must become smaller but still provide sufficient mechanical (bonding) strength. However, conventional bonding pad designs often have quality and reliability problems, particularly designs with lead free termination electrodes (or solder bumps). The typical coexistence of copper and tin in conventional bonding pad designs promotes the formation of unwanted intermetallic compounds, such as $Cu_3Sn$. The presence of these intermetallic compounds can create voids, and thus degrade the integrity of a solder joint. These and other limitations will be described in further detail throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides methods and structures for manufacturing bonding pad structures for advanced integrated circuit devices. But it would be recognized that the invention has a much broader range of applicability.

In a specific embodiment, the invention provides a method for manufacturing a bond pad structure. A substrate is provided. Next, a metal pad and passivation layer are formed over the substrate. The passivation layer includes an opening to expose a portion of the metal pad. A first film is deposited at least over the exposed portion of the metal pad. A second film is deposited over the first film. A photoresist layer is deposited over the surface of the structure, and a trench is formed in the photoresist layer directly over the exposed portion of the metal pad using a mask. A first layer is electroplated in the trench over the second film, and a barrier layer (which can comprise Nickel) is electroplated in the trench over the first layer. A termination electrode, comprising tin, is electroplated in the trench over the barrier layer. The photoresist layer is removed. In addition, the method includes etching to remove the second film and first film disposed beyond a predetermined area. The termination electrode is then reflowed. The barrier layer prevents formation of an intermetallic compound in proximity to the first layer by precluding diffusion of tin from the termination electrode to the first layer.

In another embodiment, the present invention provides an integrated circuit device. The integrated circuit device includes a substrate, at least one metal pad formed on the substrate, and a passivation layer having an opening formed around the at least one metal pad. The device also includes a multilayered under bump metallurgy (UBM) structure (also called a ball limiting metallurgy (BLM) structure) coupled to the at least one metal pad. The UBM structure includes a chromium PVD thin film, a copper PVD thin film over the chromium PVD thin film, a plated copper layer over the copper PVD thin film, and a plated nickel layer over the plated copper layer. A termination electrode, that includes tin, is coupled to the under bump metallurgy structure. The plated nickel layer prevents formation of an intermetallic compound in proximity to the copper layer by precluding diffusion of tin from the termination electrode to the copper layer.

In yet another embodiment, a method for manufacturing a bond pad structure is provided. The method includes providing a substrate. At least one metal pad and a passivation layer are formed over the substrate. The passivation layer includes an opening to expose a portion of the at least one metal pad. An adhesion layer is deposited at least over the exposed portion of the at least one metal pad. Next, a wetting and conducting layer is deposited over the adhesion layer, and a photoresist layer is deposited over a surface. A trench is formed in the photoresist layer directly over a portion of the metal pad using a mask. In a specific embodiment, the perimeter of the trench defines an area that coincidences with boundaries of the at least one metal pad. A copper layer is electroplated in the trench over the wetting and conducting layer, and a barrier layer is deposited in trench over the copper layer. In addition, a termination electrode, that includes tin, is electroplated in the trench over the barrier layer. The photoresist layer is removed. The wetting and conducting layer and adhesion layer disposed outside the area are removed by etching. The termination electrode is reflowed. The barrier layer prevents formation of an intermetallic compound in proximity to the copper layer by precluding diffusion of tin from the termination electrode to the copper layer.

Many benefits are achieved by way of the present invention over conventional techniques. For example, the present technique provides an easy to use process that relies upon conventional technology. In some embodiments, the method provides a bond pad structure. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. More particularly, the invention provides methods and structures for manufacturing bonding pad structures for advanced integrated circuit devices. But it would be recognized that the invention has a much broader range of applicability.

Figure 1:
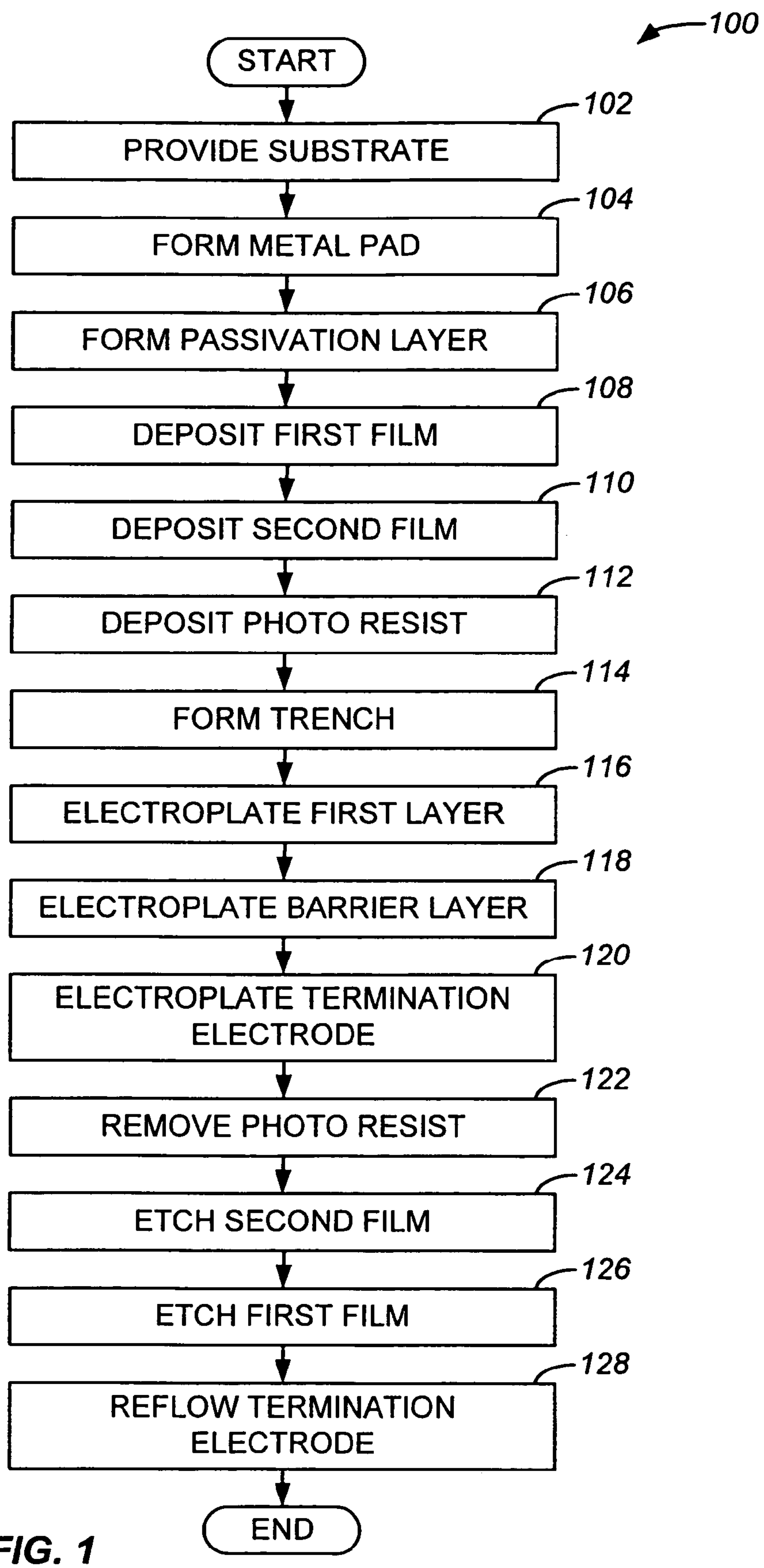
FIG. 1 illustrates a method for manufacturing a bonding pad structure according to an embodiment of the present invention.

FIG. 1 is a simplified method for manufacturing a bonding pad structure according to an embodiment of the present invention. The method 100 includes the following processes:

1. Process 102 for providing a substrate.
2. Process 104 for forming a metal pad over the substrate.
3. Process 106 for forming a passivation layer over the substrate. The passivation layer has an opening to expose a portion of the metal pad.
4. Process 107 for removing an oxidized metal layer on top of the metal pad using a radio frequency sputtering etch method.
5. Process 108 for depositing a first film at least over the exposed portion of the metal pad. In a specific embodiment, the first film is a PVD thin film that includes chromium.
6. Process 110 for depositing a second film at least over the portion of the metal pad. In a specific embodiment, the second film is a PVD thin film that includes copper.
7. Process 112 for depositing a photoresist layer over the substrate.
8. Process 114 for forming (patterning) a trench in the photoresist directly above the portion of the metal layer region using a photolithographic process.
9. Process 115 for removing photoresist residue in the trench using a plasma descum etch process.
10. Process 116 for electroplating a first layer in the trench over the second film. In a specific embodiment, the first layer includes copper.
11. Process 118 for electroplating a barrier layer in the trench over the copper layer. In a specific embodiment, the barrier layer includes nickel.
12. Process 120 for electroplating a termination electrode in the trench over the barrier layer. In a specific embodiment, the termination electrode includes tin.
13. Process 122 for removing the photoresist layer.
14. Process 124 for etching to remove the second film disposed beyond a predetermined area.
15. Process 126 for etching to remove the first film disposed outside the area. Processes 124 and 126 can be combined in some embodiments.
16. Process 128 for reflowing the termination electrode.

The above sequence of processes provides a method according to an embodiment of the present invention. Other alternatives can also be provided where processes are added, one or more processes are removed, or one or more processes are provided in a different sequence without departing from the scope of the claims herein. For example, additional processes are provided to form an additional metal layer region within a passivation layer. Future details of the present invention can be found throughout the present specification and more particularly below.

Figure 2A:
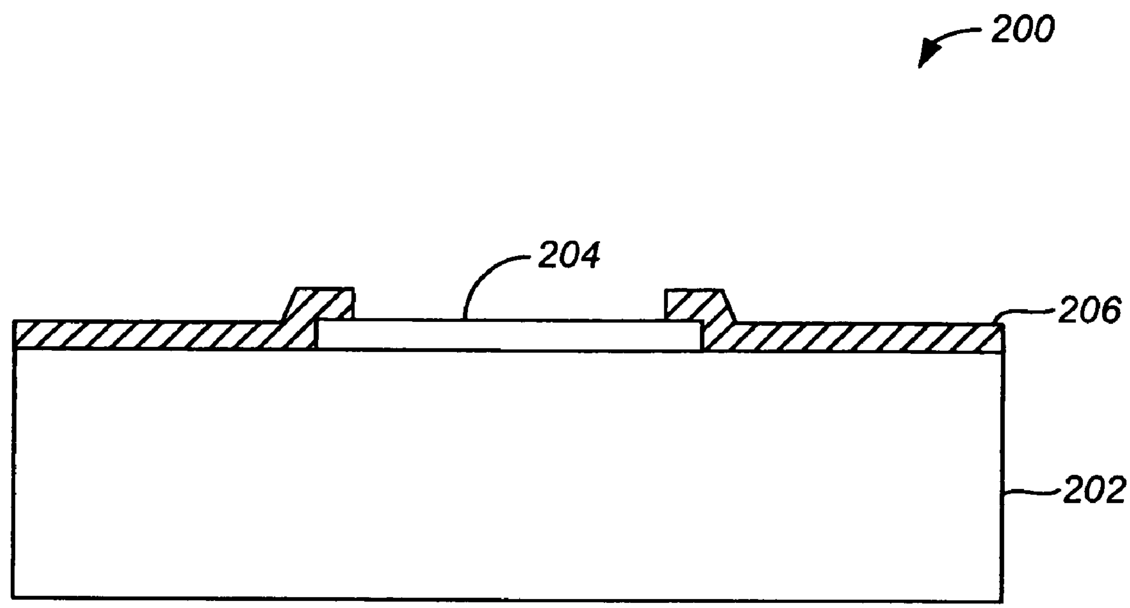
FIGS. 2A-2G are simplified diagrams illustrating cross-sectional views of a bonding pad structure during manufacturing according to an embodiment of the present invention.

FIGS. 2A-2G are simplified diagrams illustrating cross-sectional views of a bonding pad structure 200 during manufacturing according to an embodiment of the present invention. These diagrams are merely examples, which should not unduly limit the scope of the claims herein. One of ordinary skill in the art would recognize many variations, alternatives, and modifications. As shown in FIG. 2A, bonding pad structure 200 includes a substrate 202. Preferably, substrate 202 is a silicon wafer or silicon on insulator wafer or the like. Substrate 202 typically includes thereon or therein electronic devices (such as MOS devices, resistors, transistors, diodes, capacitors, and the like).

In this specific embodiment, a passivation layer 206 overlies substrate 202. In alternate embodiments, one or more intermediary layers may be disposed between passivation layer 206 and substrate 202, such as a dielectric layer and/or a fluorine doped silicate glass layer. Passivation layer 206 assures the surface is rendered chemically passive and oxidation is prevented. Passivation layer 206 itself can include one layer (e.g., a silicon oxynitride (SiOxNy) layer) or more layers (e.g., a silicon oxide layer underlying a silicon nitride or silicon oxynitride layer). Passivation layer 206 has an opening formed around a portion of metal pad 204. Metal pad 204 can generally include aluminum (Al), copper (Cu), or other metal materials. Furthermore, metal pad 204 is preferably rectangular, but can be any arbitrary shape (e.g., polygon, circular, oval, square, etc.)

Figure 2B:
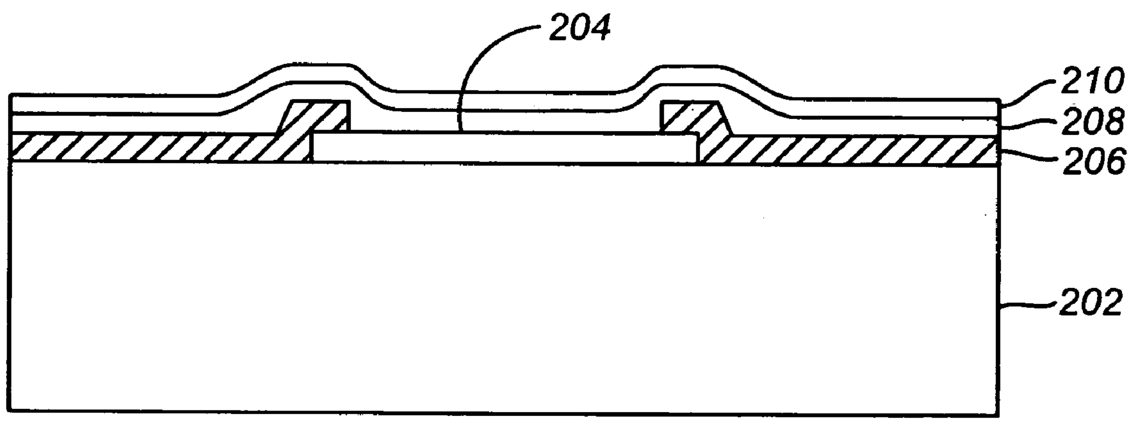

FIG. 2B illustrates the deposition of the under bump metallurgy (UBM) structure. In this specific embodiment, the UBM structure includes a first PVD thin film 208 and a second PVD thin film 210. The first PVD thin film 208 and the second PVD thin film 210 can be deposited using a sputtering method. Before depositing the first PVD thin film 208, an oxidized metal layer on top of the metal pad 204 is removed using a radio frequency sputtering etch process. The first PVD thin film 208 (or adhesion layer) adheres the UBM structure to metal pad 204. First PVD thin film 208 ranges from about 500 to about 1000 Angstroms, and can include chromium. The second PVD thin film 210 provides a wetting and conducting layer. Second PVD thin film 210 ranges from about 2000 to 4000 Angstroms, and can include copper. The second PVD thin film 210 has a thickness that is greater than a thickness of the first PVD thin film 208. In a specific embodiment, the second PVD thin film 210 has a thickness that is at least two times a thickness of the first PVD thin film 208.

Figure 2C:
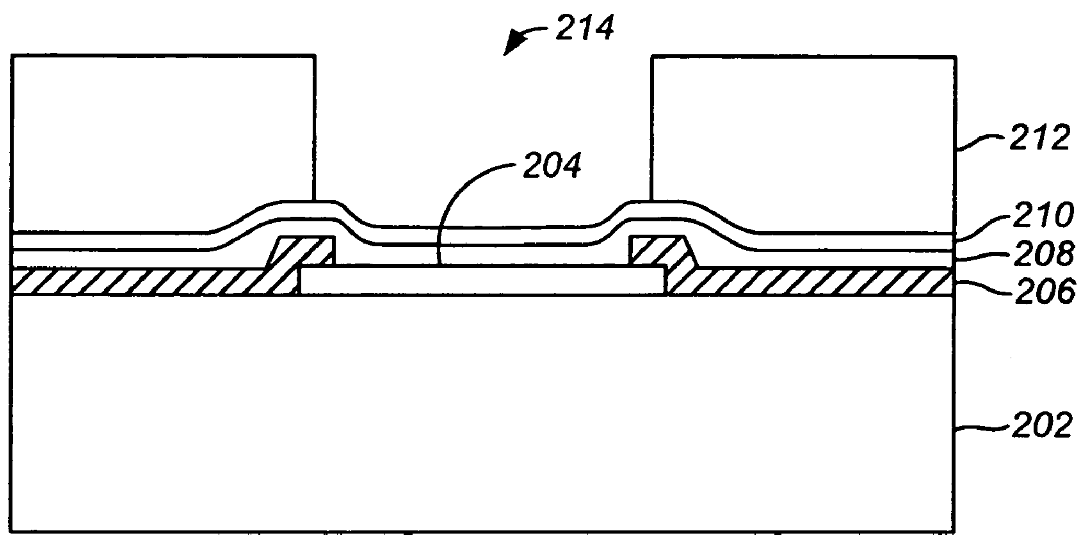

A photoresist layer 212 is deposit over substrate 202. As shown in FIG. 2C, a trench 214 is formed in the photoresist layer 212 directly above a portion of the metal pad 204. Trench 214 can be formed by a photolithographic process using a mask. It should be noted that, in an alternative embodiment, an antireflective layer (not shown) can be applied beneath photoresist layer 212. The antireflective layer reduces surface reflectivity for improved dimensional control of features during a photolithographic process.

Figure 2D:
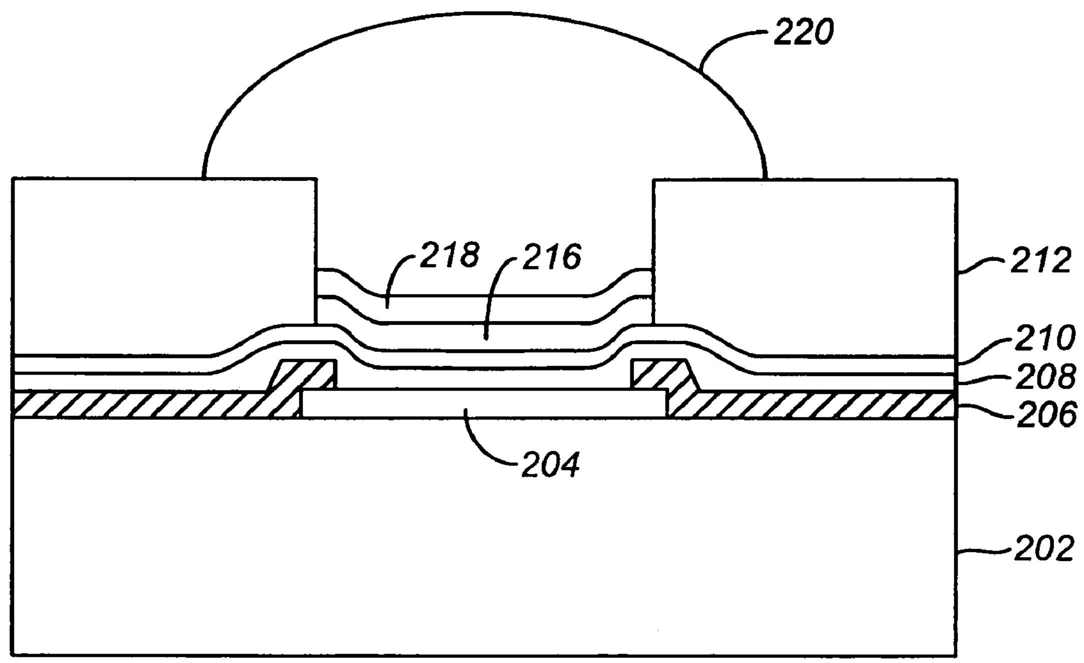

In FIG. 2D, a third layer 216 of the UBM structure is formed in the trench above the second PVD thin film 210. And, a fourth layer 218 is formed in the trench above third layer 216. Third layer 216 and fourth layer 218 each can be formed using an electroplating process. Preferably, third layer 216 included plated copper and fourth layer 218 (or barrier layer) includes plated nickel. Above fourth layer 218, a termination electrode 220 is formed. In one embodiment, the termination electrode 220 is formed using an electroplating process. In a specific embodiment, termination electrode 220 is a lead free solder bump that includes tin. However, in alternative embodiments, termination electrode 220 can be any eutectic solder or any high lead solder, particularly those that include tin. The termination electrode 220 can also include silver or other suitable materials. Fourth layer 218, disposed between third layer 216 and termination electrode 220, provides a barrier that reduces, or precludes, formation of unwanted intermetallic compounds. For example, a fourth layer of plated nickel would reduce, or preclude, formation of $Cu_3Sn$ in the vicinity of an underlying third layer of plated copper if the termination electrode 220 contains tin. The benefits of this particular embodiment of the present invention will be more pronounced for a lead free solder, which typically contains about 96% to 98% tin, than an eutectic solder or a high lead solder. Eutectic solders and high lead solders typically can comprise about 63% and about 5% tin, respectively. The fourth layer 218 has a thickness that is greater than a thickness of the third layer 216. In a specific embodiment, the third layer 216 has a thickness range between 0.2 microns to 0.8 microns and the fourth layer 218 has a thickness range between 2 microns to 6 microns.

Figure 2E:
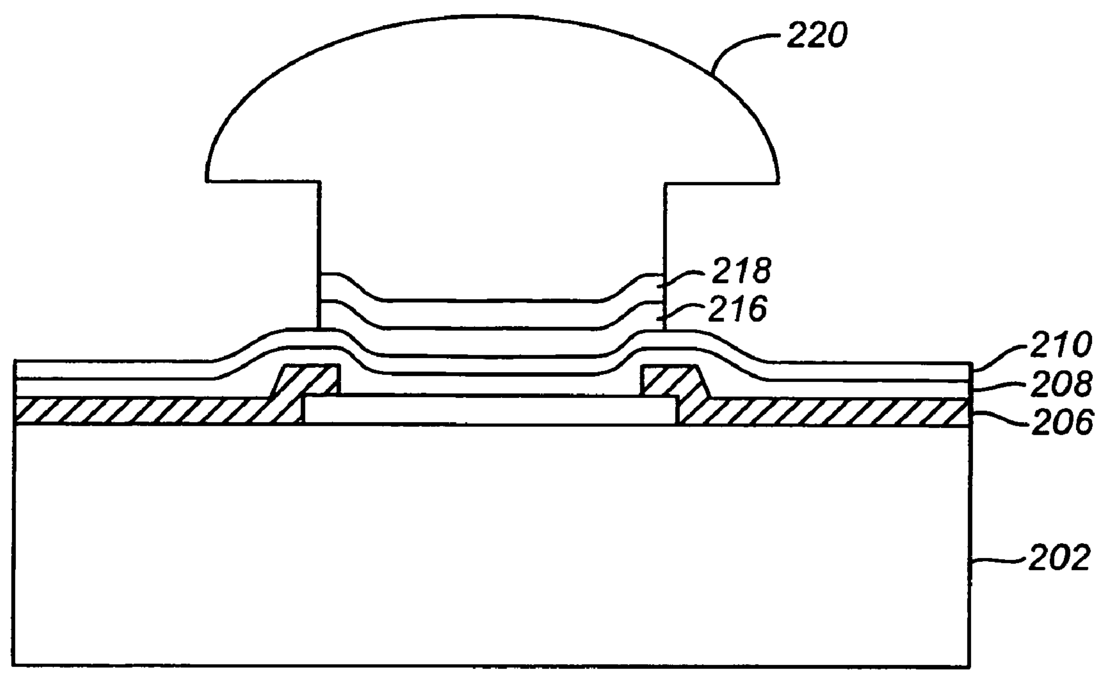
Figure 2F:
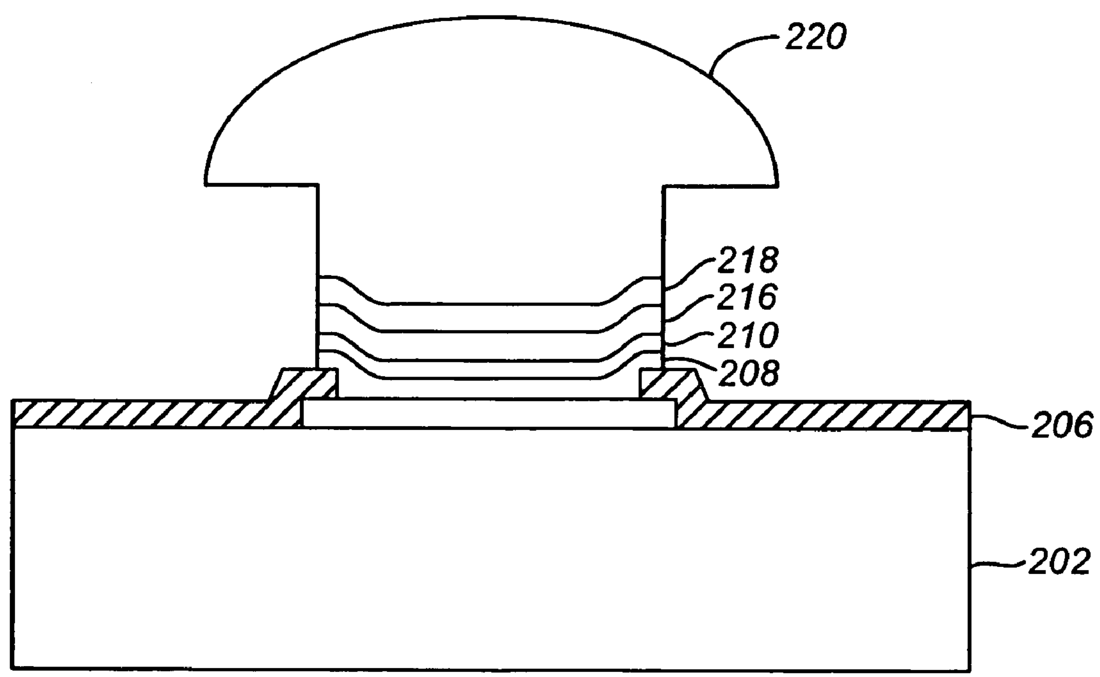

Photoresist layer 212 is removed as shown in FIG. 2E. Removal can be accomplish by many processes, including a stripping process and an ashing process. In embodiments of the present invention having an underlying antireflective layer, the antireflective layer is removed as well, usually with a wet etching process. Next, as illustrated in FIG. 2F, excess portions of the second PVD thin film 210 and first PVD thin film 208 can be removed. In a specific embodiment, the excess portions correspond to regions outside a predetermined area defined by the dimensions of trench 214. In this way, each of the four layers of the UBM structure are aligned and have coincident edges around the entire perimeter. Alternatively, the second PVD thin film 210 and the first PVD thin film 208 can be etched but still extend beyond the dimensions of trench 214.

Figure 2G:
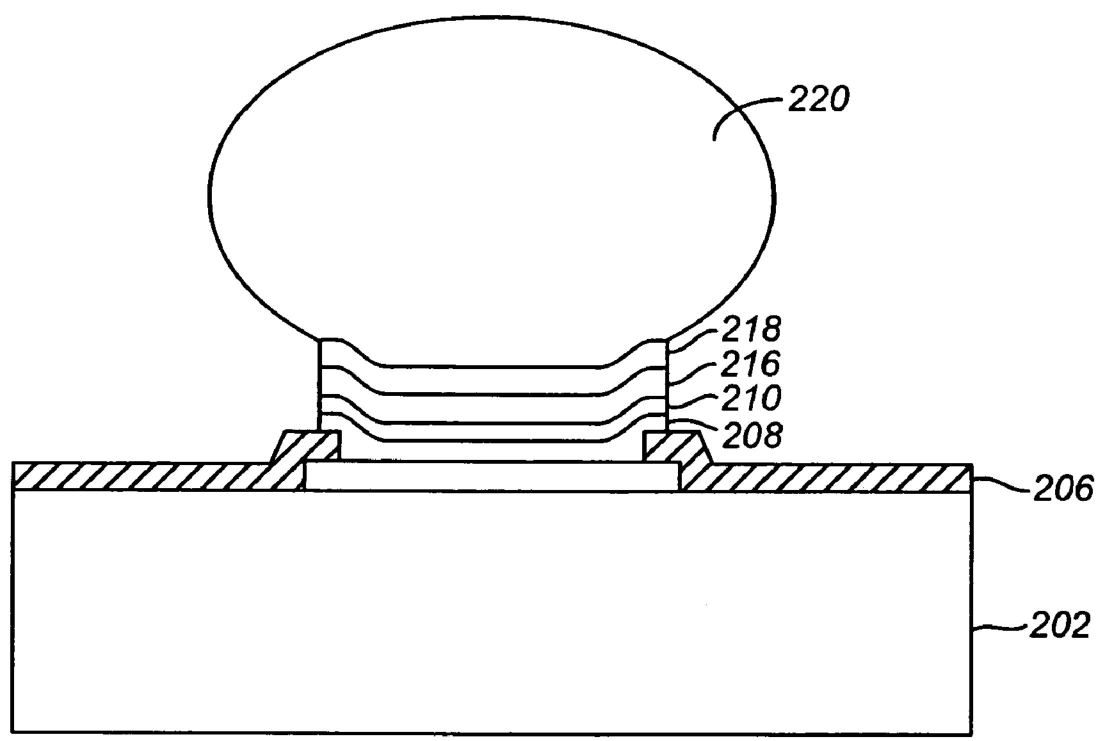

As shown in FIG. 2G, termination electrode is reflowed to provide a strong binding between termination electrode 220 and the UBM structure. As a result of the reflow, solder balling can occur with termination electrode 220. The reflowed process at elevated temperatures also releases the stress of the plated copper and PVD thin films of copper and chromium structures.

Figure 3:
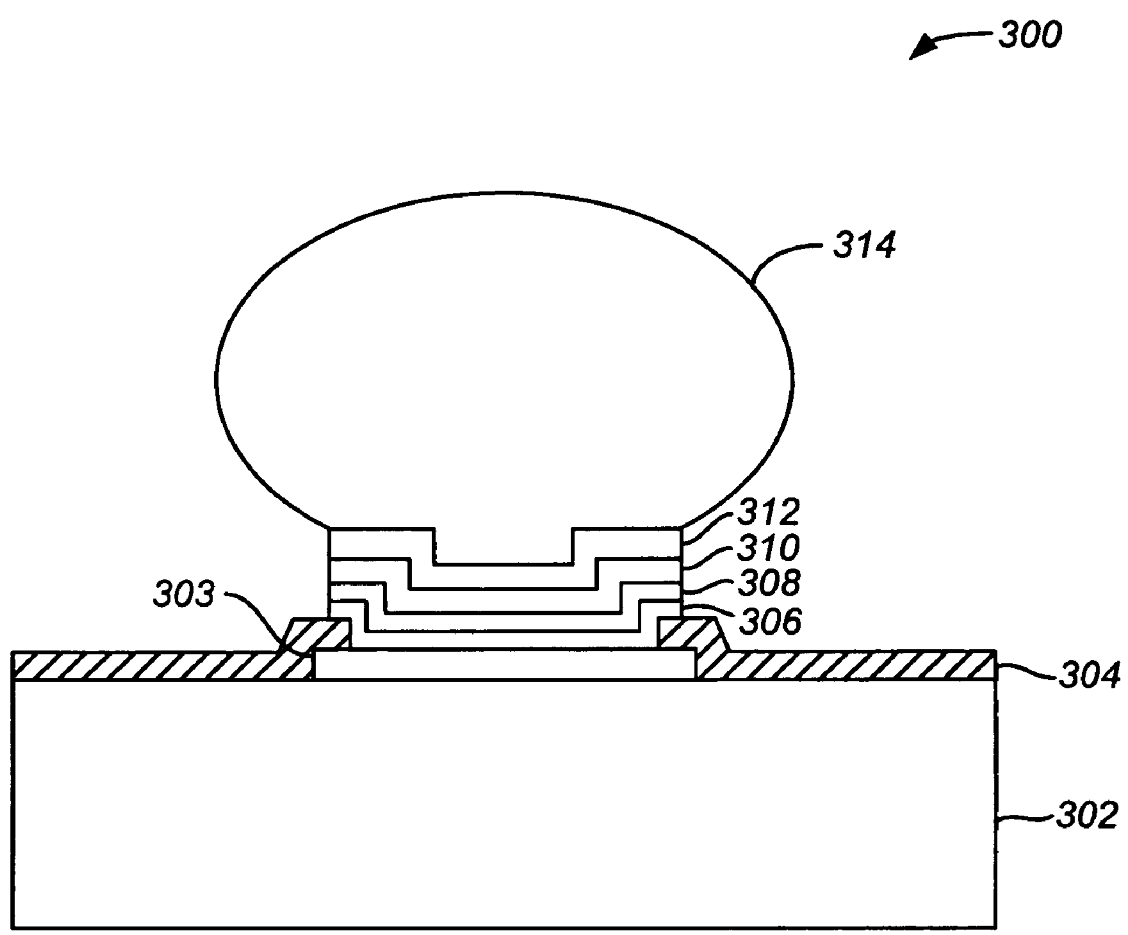
FIG. 3 is a simplified diagram illustrating a cross-sectional view of a bonding pad structure according to an embodiment of the present invention.

FIG. 3 is a simplified diagram illustrating a cross-sectional view of a bonding pad structure 300 according to an embodiment of the present invention. This diagram is merely an example, which should not unduly limit the scope of the claims herein. One of ordinary skill in the art would recognize many variations, alternatives, and modifications. As shown, an integrated circuit device can include a substrate 302 and at least one metal pad 303 formed on substrate 302. A passivation layer 304, having an opening formed around the at least one metal pad 303, is disposed over substrate 302. A UBM structure coupled to the at least one metal pad 303. The under bump metallurgy can include (i) a chromium PVD thin film 306, (ii) a copper PVD thin film 308 over the chromium PVD thin film 306, (iii) a plated layer 310 of copper over the copper PVD thin film 308, and (iv) a plated layer 312 of nickel over the plated layer 310. A termination electrode 314, that includes tin, is coupled to the UBM structure. The plated layer 312 prevents formation of an intermetallic compound in proximity to layer 310 by precluding diffusion of tin from termination electrode 314 to layer 310.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a bond pad structure, the method comprising:

providing a substrate;

forming a metal pad over the substrate;

forming a passivation layer over the substrate having an opening to expose a portion of the metal pad;

removing an oxidized metal layer on the metal pad using a radio frequency (rf) sputtering etch method;

depositing a first PVD thin film comprising chromium at least over the exposed portion of the metal pad;

depositing a second PVD thin film comprising copper over the first PVD thin film;

depositing a photoresist layer over the substrate;

forming a trench in the photoresist layer over at least a portion of the metal pad using a mask;

removing photoresist residue in the trench using a plasma descum etch process, while maintaining the first PVD thin film and the second PVD thin film;

electroplating a first layer comprising copper in the trench over the second PVD thin film;

electroplating a barrier layer comprising nickel in the trench over the first layer;

electroplating a termination electrode in the trench over the barrier layer, the termination electrode comprising tin;

removing the photoresist layer;

etching to remove the second PVD thin film disposed beyond an area;

etching to remove the first PVD thin film disposed beyond the area; and reflowing the termination electrode to release stress of the first layer, the terminal electrode being coupled to the barrier layer and atop of the barrier layer, wherein the barrier layer prevents formation of an intermetallic compound in proximity to the first layer by precluding diffusion of tin from the termination electrode to the first layer, and wherein the second PVD thin film has a second thickness at least about twice a first thickness of the first PVD thin film.

2. The method of claim 1 wherein the intermetallic compound is free of $Cu_3Sn$.

3. The method of claim 1 wherein the termination electrode further comprises silver.

4. The method of claim 1 wherein the substrate is at least one of a semiconductor substrate, dielectric layer, and fluorine doped silicate glass layer.

5. The method of claim 1 wherein the depositing of the first PVD thin film is accomplished by sputter deposition.

6. The method of claim 1 wherein the depositing of the second PVD thin film is accomplished by sputter deposition.

7. The method of claim 1 wherein a thickness of the first PVD thin film ranges from about 500 to about 1000 Angstroms.

8. The method of claim 1 wherein a thickness of the second PVD thin film ranges from about 2000 to about 4000 Angstroms.

9. The method of claim 1 wherein a thickness of the first layer ranges from about 0.2 microns to about 0.8 microns.

10. The method of claim 1 wherein a thickness of the barrier layer ranges from about 2 microns to about 6 microns.

11. The method of claim 1 wherein a thickness of the barrier layer is greater than a thickness of the first layer.

12. The method of claim 1 wherein the metal pad comprises aluminum.

13. The method of claim 1 wherein the passivation layer comprises at least one of silicon oxynitride material, silicon oxide material, or silicon nitride material.

14. A method for manufacturing a bond pad structure, the method comprising:

providing a substrate;

forming at least one metal pad over the substrate;

forming a passivation layer over the substrate having an opening to expose a portion of the at least one metal pad;

removing an oxidized layer on the metal pad using a radio frequency (rf) sputtering etch method;

depositing an adhesion layer at least over the exposed portion of the at least one metal pad;

depositing a wetting and conducting layer over the adhesion layer;

depositing a photoresist layer over the substrate;

forming trench in the photoresist layer directly over the exposed portion of the metal pad using a mask, a perimeter of the trench defining an area parallel to the at least one metal pad;

removing a photoresist residue in the trench using a plasma descum etch process, while maintaining the wetting layer and the conducting layer;

electroplating a copper layer in the trench over the wetting and conducting layer;

electroplating a barrier layer in trench over the copper layer;

electroplating a termination electrode in the trench over the barrier layer, the termination electrode comprising tin;

removing the photoresist layer;

etching to remove the wetting and conducting layer disposed outside an area;

etching to remove the adhesion layer disposed outside the area; and reflowing the termination electrode to release stress of the copper layer, the terminal electrode being coupled to the barrier layer and atop of the barrier layer, wherein the barrier layer prevents formation of an intermetallic compound in proximity to the copper layer by precluding diffusion of tin from the termination electrode to the copper layer, and wherein the wetting and conducting layer has a thickness at least about twice a thickness of the adhesion layer.

* * * * *